(12) United States Patent
Wieland et al.

(10) Patent No.: US 7,071,699 B2
(45) Date of Patent: Jul. 4, 2006

(54) NON-LOAD DRIVEN FAULT MONITOR FOR ELECTRICAL CIRCUITS

(75) Inventors: Stephen Wieland, Westland, MI (US); Edward Mazorowicz, Canton, MI (US)

(73) Assignee: Alcoa Inc., Pittsburgh, PA (US)

( * ) Notice: Subject to any disclaimer, the term of this patent is extended or adjusted under 35 U.S.C. 154(b) by 0 days.

(21) Appl. No.: 10/825,448

(22) Filed: Apr. 15, 2004

(65) Prior Publication Data

US 2005/0231208 A1   Oct. 20, 2005

(51) Int. Cl.
*G01R 31/08* (2006.01)
(52) U.S. Cl. .................................... 324/525; 324/522
(58) Field of Classification Search ................ 323/315; 324/525, 414, 522; 327/538; 361/18
See application file for complete search history.

(56) References Cited

U.S. PATENT DOCUMENTS

| | | | | |
|---|---|---|---|---|
| 3,855,587 A | * | 12/1974 | Jacobs | 315/89 |
| 4,291,302 A | * | 9/1981 | King et al. | 340/642 |
| 4,297,632 A | * | 10/1981 | Glaser et al. | 324/414 |
| 4,661,717 A | * | 4/1987 | Nishioka | 340/458 |
| 5,065,104 A | * | 11/1991 | Kusko et al. | 324/508 |

* cited by examiner

*Primary Examiner*—Walter Benson
(74) *Attorney, Agent, or Firm*—Greenberg Traurig LLP; Harry A. Hild, Jr.

(57) ABSTRACT

A fault monitor for the load portion of an electrical circuit may be connected to an existing circuit by a single connection, and may detect flaws within the load portion of the circuit through the detection of changes in voltage through a resistor, caused by changes in current flow due to changing resistance within the load portion of the circuit.

3 Claims, 1 Drawing Sheet

NON-LOAD DRIVEN FAULT MONITOR FOR ELECTRICAL CIRCUITS

FIELD OF THE INVENTION

The present invention relates to testing of electrical circuits. More specifically, the invention provides a fault monitor for testing the load portion of an electrical circuit for faults.

DESCRIPTION OF THE RELATED ART

Motor vehicles presently contain a variety of electronic devices, for example, light bulbs, which must be properly functioning both to ensure safety and to keep the vehicle in compliance with the statutorily prescribed safety equipment guidelines.

Presently existing fault detection devices utilize switching devices with current sensing capabilities, or devices for measuring voltage drop across a low impedance resistor as part of the switching device. Such devices are typically expensive, especially if designed for monitoring high current devices. Furthermore, such devices generally need to be included in the original circuit design, or require substantial reworking of the original circuit design to be incorporated into the circuit.

Accordingly, there is a need for a fault monitoring device that may be integrated into an existing electrical circuit without substantial modification of the existing circuit. There is a further need for a fault monitoring device having a lower cost than presently available devices.

SUMMARY OF THE INVENTION

The present invention provides a fault monitor for the load portion of an electrical circuit that may be added to the circuit with only minimal modification. The fault monitor may be added by splicing a single connection into the existing circuit.

A fault monitor of the present invention includes a power supply connected in series with a resistor, a connection for connecting to the circuit to be monitored with the load of that circuit in parallel with the resistor, a current sensor connected in series with the resistor, and switching means for opening and closing the connection between the power supply and the resistor and load.

The invention may further include a means for determining whether current is flowing through the load before and after the test, because the test should be performed without current from other sources flowing through the load. The means for determining whether current is flowing through the load include a switching means connected in series with the resistor, and in parallel with the current sensor. By closing the switching means, any current flowing through the load will also be drawn through the parallel circuit including the current sensor. If the reading of the current sensor is ground, a test may be performed. If the current sensor reads any amount of current, the test must be delayed. A preferred test switching means include a transistor, such as an NPN digital transistor, connected between the resistor and a ground, with a switched pull-down resistor supplying the transistor's input. When a positive potential is supplied through the switched pull-down resistor, current may flow through the transistor to the ground, so that any current flowing through the load will also be drawn through the parallel resistor, test switching transistor, and also the current sensor. If the current sensor reads ground, there is no current flowing through the load, and a test may be performed. Otherwise, the test must be delayed.

Once it is determined that no current is flowing through the load, power may be simultaneously applied through the parallel connected resistor and load. A preferred switching means for supplying power to the resistor and the load include a transistor, for example, a digital NPN transistor. A switched 12-volt supply supplies the input of the digital transistor, with a positive potential at the input permitting current flow through the transistor. In some preferred embodiments, the current flowing through the digital NPN transistor provides a negative input to a second PNP transistor, thereby permitting the flow of power through the PNP transistor to the load and resistor. The load, which may be a plurality of bulbs wired in parallel, will provide a resistance equivalent to that of a single resistor according to the well-known principals of Ohm's law. The equivalent resistance will change if one or more of the bulbs within the load have burned out, thereby changing the amount of current that may pass through the circuit for a given supply voltage. Changes in this current will result in a change in the voltage applied to a voltage sensor.

After testing for faults within the load, the circuit should again be tested to see if current is flowing to the load from the load's main power source, to ensure that this power was not turned on during the test.

Accordingly, it is an object of the present invention to provide a fault monitor for an electrical circuit that may be installed on a preexisting electrical circuit by merely making a single additional connection to the circuit.

It is another object of the invention to provide a fault monitor capable of detecting the number of component failures within a load consisting of multiple electrical devices in parallel.

It is a further aspect of the present invention to provide a fault monitor having a means for determining whether the load to be tested for faults is on or off before and/or after a test is performed.

It is another object of the invention to provide a fault monitor having a means for protecting the components within the fault monitor from damage due to excessive voltage or current.

It is further object of the invention to provide a fault monitor having lower costs than presently available fault monitors.

These and other objects of the invention will become more apparent through the following description and drawings.

BRIEF DESCRIPTION OF THE DRAWINGS

The sole FIGURE is a schematic view of a fault monitor according to the present invention, illustrated in conjunction with a circuit for which fault monitoring is desired.

Like reference characters denote like elements throughout the drawing.

DETAILED DESCRIPTION OF PREFERRED EMBODIMENTS

Figure 1:
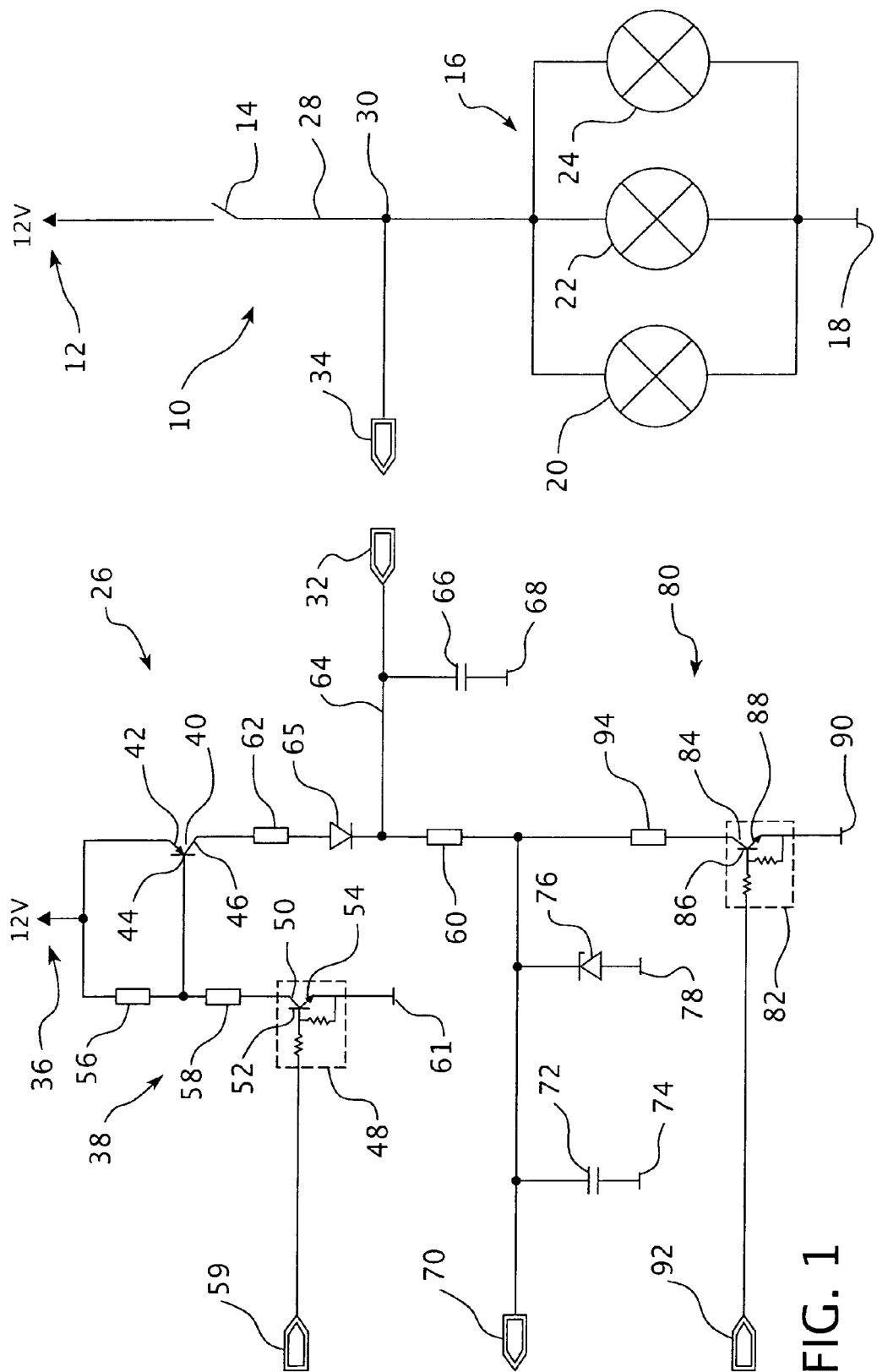

The present invention provides a fault meter for testing for faults within an electrical circuit. Referring to the FIGURE, a typical electrical circuit 10 with which the present invention will be used is illustrated. The circuit 10 includes a power supply 12 connected through a switching device 14 to a load 16, and finally through a ground 18. The load 16 illustrated in the FIGURE includes a plurality of bulbs 20, 22, 24 connected in parallel. The circuit 10 may represent, for example, a high mount stop light on a motor vehicle.

The fault monitor 26 may be connected to the circuit 10 by splicing into the wire 28 at point 30, or in other preferred embodiments may be connected or disconnected to the circuit 10 using the mating connectors 32, 34.

The fault monitor 26 includes a power supply 36 connected to switching mechanism 38. A preferred switching mechanism includes a first transistor 40, which may in the illustrated example be a PNP transistor 40 having an entrance 42, input 44, and collector 46. The power supply 36 may also be connected to a second transistor 48, which in the illustrated example is a digital NPN transistor having an entrance 50, an input 52, and an emitter 54. A pair of resistors 56, 58 are connected in series between the power supply 36 and the entrance 50 of the transistor 48. The input 44 of the transistor 40 is connected between the resistors 56, 58, thereby providing a voltage divide for the input 44. The resistors 56, 58 may, in some embodiments, provide resistance of about 1.0 KΩ and about 4.7 KΩ, respectively. The input 52 is connected to a power source, for example, the switched 12-volt power supply 59. The emitter 54 is connected to a ground 61. When a positive potential is supplied from the power supply 59 to the input 52 of the transistor 48, current is permitted to flow from the power supply 36 to the ground 61. This current will provide a negative potential at the voltage divide between the resistors 58, 56, thereby providing a negative potential to the input 44 of the transistor 40, permitting current to flow therethrough from the power supply 36. While the present invention is not limited to the illustrated switching mechanism 38, the illustrated switching mechanism 38 provides for fine tuned switching through the digital transistor 48, and the potential to handle higher current through the transistor 40.

The fault monitor 26 also includes a resistor 60, and may also include a resistor 62, in series with the collector 46 of the transistor 40. The resistors 60, 62 may in some embodiments provide resistance of about 330 KΩ and about 20 Ω, respectively. The resistor 62 limits the current passing through the load 16 to a level below that required to light the bulbs 20, 22, 24, thereby ensuring that the test process does not light the bulbs 20, 22, 24 at a time when they should not be lit. A capacitor 66 connected in series with the ground 68 and in parallel with both the resistor 60 and the load 16 provides for a more uniform flow of current through the resistor 60 and load 16. The capacitor 66 may in some embodiments provide a capacitance of about 0.1 μF. The diode 65 resists current flow in through the resistor 62 towards the power supply 36.

A sensor 70, which may be an analogue filament resistance sensor for sensing voltage, is connected in series with the resistor 60. The sensor 70 may be provided with a parallel connected capacitor 72 connected in series with the ground 74 for providing an even flow of current to the sensor 70. The capacitor 72 may in some embodiments provide a capacitance of about 0.1 μF. The sensor 70 may also be provided with a parallel connected Zener diode 76, connected in series with the ground 78. The Zener diode 76 will resist current flow unless the voltage exceeds a predetermined maximum, in which case current will flow through the Zener diode 76 to the ground 78, thereby protecting the sensor 70 from damage. In some preferred embodiments, the Zener diode may have a breakdown voltage of about 5.1 volts.

The fault monitor 26 may also be provided with a means for determining whether current is flowing from the power supply 12 to the load 16. The test must be conducted with the switch 14 open, and no current flowing through the bulbs 20, 22, 24. The means 80 for detecting current flow from the power supply 12 includes a test switching means which, in the illustrated example, is the digital NPN transistor 82 having an entrance 84 connected in series with the resistor 60, an input 86, and an emitter 88 connected to the ground 90. The input 86 is connected to a power supply 92 which in the illustrated example is a pull-down resistor switch. A resistor 94 may be provided between the resistor 60 and the transistor 82 to provide a voltage divide for the sensor 70, thereby protecting the sensor 70 from damage from excess voltage. The resistor 94 may, in some embodiments, provide a resistance of about 100 KΩ.

To test the load 16 for faults, the pull-down resistor switch 92 will apply a positive potential to the input 86 of the transistor 82, so that if the switch 14 is closed, current from the power source 12 will flow through the transistor 82, and to the sensor 70. If the sensor 70 indicates that no current is flowing, then a test may be performed. If current is flowing through the load 16, then the test must be delayed. The resistors 60, 94 minimize the current that is drawn away from the load 16, so that if the bulbs should be lit, they will remain lit during the test.

To perform the test, the switched 12-volt power supply 59 will apply a positive potential to the input 52 of the transistor 48, thereby permitting current to flow from the power supply 36 through the transistor 48. A negative potential will thereby be applied to the input 44 of the transistor 40, thereby permitting current from the power supply 36 to flow therethrough. This current will therefore be supplied to the resistor 60 and sensor 70, and to the bulbs 20, 22, 24. As can be seen from the FIGURE, the voltage applied to both the resistor 60 and to each of the bulbs 20, 22, 24 will remain constant. However, if one or more of the bulbs 20, 22, 24 has burned out, the current will vary according to the well-known principals of Ohm's law. According to well-known principals, the bulbs 20, 22, 24 will provide a resistance equal to that of a hypothetical single resistor, designated herein as $R_{eq}$. The resistance of $R_{eq}$ can be determined by the equation:

$$\frac{1}{R_{eq}} = \frac{1}{R_{20}} + \frac{1}{R_{22}} + \frac{1}{R_{24}}$$

where $R_{20}$, $R_{22}$, and $R_{24}$ each denote the resistance of the bulbs 20, 22, 24, respectively. Therefore, $$R_{eq} = \frac{1}{\frac{1}{R_{20}} + \frac{1}{R_{22}} + \frac{1}{R_{24}}}.$$

The current flowing through the circuit will flow according to the equation V=IR, where V is the voltage, I is the current, and R is the resistance. Therefore, the current flowing through the load 16 may be determined by the equation $$I = \frac{V}{R}.$$

Because the current flow through the resistor 60 to the sensor 70 is negligible, $R_{eq}$ plus the resistance of the resistor 62, hereinafter $R_{62}$, will determine the total current flowing through the circuit. Therefore, the current flowing through the circuit is determined by the equation $$I = \frac{V}{R_{eq} + R_{62}}.$$

With the current thereby determined and the resistance of the resistor 60 (hereinafter $R_{60}$) being constant, the voltage applied to the sensor 70 (hereinafter $V_{70}$) becomes $V_{70} = IR_{60}$.

Suppose that bulb 20 is burned out. Now, $$R_{eq} = \frac{1}{\frac{1}{R_{22}} + \frac{1}{R_{24}}}.$$

The absence of the contribution of the bulb 20 to $R_{eq}$ means that $R_{eq}$ will increase, thereby causing less current to flow through the system. Likewise, if a second bulb 22, 24 burns out, $R_{eq}$ will become equal to $R_{24}$, causing even less current to flow through the system. Obviously, if all bulbs 20, 22, 24 burn out, then no current will flow through the system. Therefore, if no bulbs 20, 22, 24 have burned out, the voltage sensed by the sensor 70 will be at a maximum, and will decrease for increasing numbers of burned out bulbs.

After completion of the test, the switched 12-volt power supply 59 is turned off, and the pull-down resisted switch 92 is again activated, to make sure that the switch 14 has not been closed during the test. If the sensor 70 reads something other ground, the switch 14 has been closed, and the test is invalid.

From the above description, it will become apparent to those skilled in the art that the above described test procedure may, if desired, be controlled by an appropriate microprocessor that has been programmed to carry out the test at various intervals, and provide indicia of bulb failure, for example, a dashboard light.

While a specific embodiment of the invention has been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the invention which is to be given the full breadth of the appended claims and any and all equivalents thereof.

What is claimed is:

1. A method of testing for faults in an electrical circuit, the circuit having a load, the method comprising the steps of:
   providing a fault monitor, having:
      a power supply connected in series with a resistor;
      a connection for connecting to the circuit with the load in parallel with the resistor;
      a voltage sensor connected in series with the resistor; and
      switching means for opening and closing the connection between the power supply and the resistor and load;
   providing a test switching means connected in series with the resistor and in parallel with the current sensor, in sequence after the first transistor;
   closing the test switching means;
   determining whether voltage is sensed by the voltage sensor, thereby determining whether current is flowing through the load;
   connecting the fault monitor to the circuit with the load in parallel with the resistor;
   passing a current through the circuit and fault monitor; and
   detecting the resulting voltage at the voltage sensor, thereby determining whether the total resistance provided by the load indicates a failure within the load and also determining a number of elements having faults within the load based on the difference between the resulting voltage and an expected voltage.

2. The method according to claim 1, wherein the steps of closing the test switching means and determining whether voltage is sensed by the voltage sensor are performed before passing a current through the circuit and fault monitor, and detecting the resulting current at the current sensor.

3. The method according to claim 1, wherein the steps of closing the test switching means and determining whether voltage is sensed by the voltage sensor are performed after passing a current through the circuit and fault monitor, and detecting the resulting voltage at the voltage sensor.

\* \* \* \* \*